(12) United States Patent
Zang et al.

(10) Patent No.: US 10,374,029 B2
(45) Date of Patent: Aug. 6, 2019

(54) SEMICONDUCTOR DEVICE RESISTOR STRUCTURE

(71) Applicant: GLOBALFOUNDRIES INC., Grand Cayman (KY)

(72) Inventors: Hui Zang, Guilderland, NY (US); Josef S. Watts, Stillwater, NY (US); Shesh M. Pandey, Saratoga Springs, NY (US)

(73) Assignee: GLOBAL FOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/848,324

(22) Filed: Dec. 20, 2017

(65) Prior Publication Data

US 2018/0122891 A1 May 3, 2018

Related U.S. Application Data

(62) Division of application No. 15/271,730, filed on Sep. 21, 2016, now Pat. No. 9,923,046.

(51) Int. Cl.
  *H01L 49/02* (2006.01)
  *H01L 21/02* (2006.01)
  *H01L 21/3205* (2006.01)
  *H01L 27/06* (2006.01)

(52) U.S. Cl.
  CPC ........ *H01L 28/20* (2013.01); *H01L 21/02164* (2013.01); *H01L 21/02181* (2013.01); *H01L 21/02532* (2013.01); *H01L 21/02579* (2013.01); *H01L 21/02595* (2013.01); *H01L 21/32055* (2013.01); *H01L 27/0629* (2013.01)

(58) Field of Classification Search
  CPC ................. H01L 28/20; H01L 27/0629; H01L 21/02532; H01L 21/02595; H01L 21/02181
  See application file for complete search history.

(56) References Cited

U.S. PATENT DOCUMENTS

| | | | |
|---|---|---|---|
| 5,622,880 | A | 4/1997 | Burr et al. |
| 2001/0009292 | A1 | 7/2001 | Nishinohara et al. |
| 2010/0244152 | A1 | 9/2010 | Bahl et al. |
| 2011/0266637 | A1 | 11/2011 | Lee et al. |
| 2014/0319620 | A1 | 10/2014 | Hoentschel et al. |

*Primary Examiner* — David Vu
(74) *Attorney, Agent, or Firm* — Anthony Canale; Hoffman Warnick LLC

(57) ABSTRACT

A resistor body is separated from a doped well in a substrate by a resistor dielectric material layer. The doped well is defined by at least one doped region and can include a dopant gradient in the doped well to reduce parasitic capacitance of the resistor structure while retaining heat dissipation properties of the substrate. The resistor body is formed in a cavity in a dielectric layer deposited on the substrate, which deposition can be part of a concurrent fabrication, such as part of forming shallow trench isolations, and the cavity can be lined with the resistor dielectric material.

16 Claims, 5 Drawing Sheets

SEMICONDUCTOR DEVICE RESISTOR STRUCTURE

BACKGROUND

Technical Field

The present disclosure relates to elements of photolithographically manufactured integrated circuits (ICs), and more specifically, to the fabrication of a resistor structure with improved heat dissipation, which may be particularly applicable in higher power and alternating current (AC) applications.

Related Art

Semiconductor devices, particularly ICs, are manufactured by depositing, patterning, and removing layers of material. Most ICs include resistors, which are typically formed using polysilicon on an insulator material to reduce parasitic capacitance during operation. However, insulators of electricity are typically thermal insulators, and resistors formed on insulators are subject to self-heating, that is, the current in the resistor raises the temperature of the resistor, which causes the resistance value to change, which, if resistance increases, can cause the temperature to raise further, which can cause the resistance to change, etc. In AC circuits, this can create non-linear behavior that can cause distortion of AC signals. It would therefore be advantageous to have resistor structures with improved heat dissipation to allow their use in higher power, AC, and/or more efficient implementations.

SUMMARY

A first aspect of the disclosure can be directed to a resistor structure comprising at least one resistor body, a resistor dielectric material below the at least one resistor body, and a first semiconductor layer of a first semiconductor material below the resistor dielectric material and the at least one resistor body. A well can be in the first semiconductor layer below the resistor dielectric material, the well including at least one doped region of the first semiconductor layer below the at least one resistor body. A first dopant can be disposed in the well in each of the at least one doped region, a type of the first dopant and at least one concentration of the first dopant being selected to provide a depletion region in the well at an operating voltage of the resistor structure.

A second aspect of the disclosure can include a method of making a semiconductor device resistor structure. A first semiconductor layer including a first semiconductor material can be provided, and a support dielectric material can be deposited on the first semiconductor layer to form a support dielectric layer on a surface of the first semiconductor layer. A plurality of cavities can be formed in the support dielectric layer, each cavity extending from a surface of the support dielectric layer to the surface of the first semiconductor layer. A well can be formed in the first semiconductor layer by doping the first semiconductor layer to form at least one doped region. The plurality of cavities can include at least one resistor cavity over the well. A resistor dielectric layer can be deposited on at least the surface of the first semiconductor layer exposed in the plurality of cavities, and a resistor body can be formed in each resistor cavity and on the resistor dielectric layer.

A third aspect of the disclosure can include a semiconductor device resistor structure having a first semiconductor layer that can include a first semiconductor material. A well can be defined in the first semiconductor layer by at least one doped region in the first semiconductor layer. A first dopant can be in each doped region of the well, the first dopant being present at a first concentration at a first distance from a surface of the well and at a second concentration at a second distance from the surface of the well that is larger than the first distance. An electrically insulative support layer can be on the first semiconductor layer, and a plurality of cavities can be formed in the electrically insulative support layer and extending from a surface of the electrically insulative support layer to a surface of the first semiconductor layer. At least one resistor body can each be formed over the well in a respective resistor cavity of the plurality of cavities.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
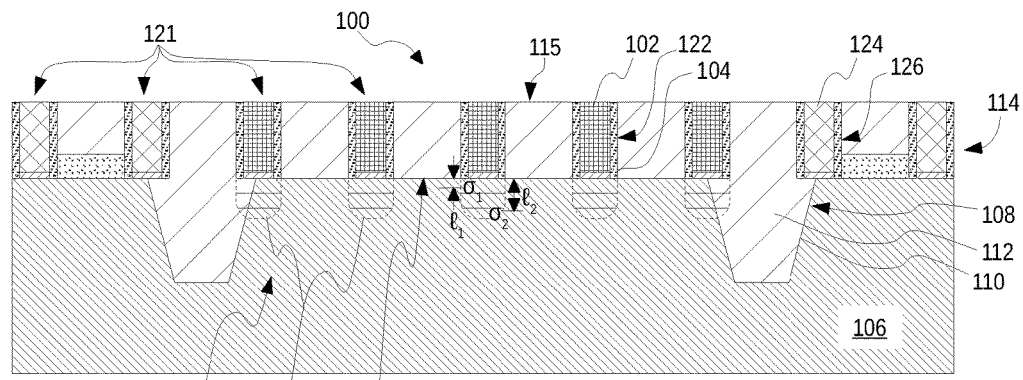
FIGS. 1-3 shows examples of implementations of a semiconductor device resistor structure according to embodiments of the disclosure.

Various examples are disclosed herein of a resistor structure that allows use of thinner dielectric layers for reduced impediment to heat transfer. A resistor body is formed on a resistor dielectric material layer over a doped well formed in a semiconductor layer, such as a substrate, the doped well reducing parasitic capacitance while providing heat dissipation. The doped well in embodiments can include a gradient of dopant concentration, which can end in a graded junction beneath the doped well, further reducing parasitic capacitance. The dopant concentration gradient and/or graded junction can be formed by, for example, multiple implantations of one or more dopants at various depths and/or concentrations, altering the conductivity and other electrical properties of the host material, but leaving the heat transfer capability of the host material largely unchanged. Additionally, the structure can be formed using steps easily integrated into middle-end-of-line or back-end-of-line processes, including in conjunction with known resistor with other device or structure fabrication processes, such as transistor fabrication. Thus, embodiments can use materials from such processes to reduce a number of steps needed to be added, such as by using a transistor gate dielectric material as the resistor dielectric material and/or metal gates formed during deposition of a metal layer. With additional heat dissipation, a resistor structure according to embodiments can be operated at higher power than conventional resistor structures.

Well-known semiconductor fabrication technique and materials can be used to implement embodiments. One of ordinary skill in the art will doubtless understand the terms used and processes referred to herein. For example, resistor bodies are described as being formed by a resistive material, using any now known or later developed techniques appropriate to deposit the material. These techniques may include, but are not limited to, chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The resistor dielectric material can be any dielectric material including, but not limited to, hydrogenated silicon oxycarbide (SiCOH), porous SiCOH, porous methylsilsesquioxanes (MS Q), porous hydrogensilsesquioxanes (HS Q), octamethylcyclotetrasiloxane (OMCTS) $(CH_3)_2SiO-)_4$ 2.7 available from Air Liquide, dielectric materials with a relatively high dielectric constant K (high-K dielectric materials) typically used for field effect transistor (FET) gates, such as hafnium oxide ($HfO_2$), etc.

The doped well can be formed in a substrate, which can include material such as, but not limited to, silicon, germanium, silicon germanium, silicon carbide, and any material consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. For example, SOI layer 106 and/or epi layer 112 may be strained.

When a material and/or layer or a portion thereof is "strained," stresses are applied thereto, which can enhance performance of semiconductor devices formed by the material and/or layer or a portion thereof. For example, the application of stresses to field effect transistors (FETs) is known to improve their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (PFET) drive currents).

The well in embodiments can include a dopant, and the examples provided below show the use of P-type dopants. A P-type dopant is an element introduced to semiconductor to generate a free hole by "accepting" an electron from a semiconductor atom and "releasing" a hole at the same time, the acceptor atom having one valence electron less than the host semiconductor. Boron (B) is the most common acceptor in silicon technology, though alternatives include indium (In) and gallium (Ga). It should be noted that Ga features high diffusivity in $SiO_2$, so $SiO_2$ should not be used as a mask during Ga diffusion.

Use of n-type dopants is within the scope of embodiments, as well. An N-type dopant is an element introduced into a semiconductor to generate a free electron by "donating" an electron to semiconductor, the donor having one more valance electron than the host semiconductor. Non-limiting examples of donors in silicon (Si) include phosphorous (P), arsenic (As), and antimony (Sb), while in gallium arsenic (GaAs), non-limiting examples of donors can include sulphur (S), selenium (Se), tin (Sn), silicon (Si), and carbon (C).

In some embodiments, epitaxy may be used to produce or "grow" a semiconductor material on a deposition surface of a semiconductor material. This can also be referred to as "epitaxial growth" and "epitaxially formed and/or grown." The semiconductor material being grown may have the same crystalline characteristics as the semiconductor material of the deposition surface. In an epitaxial growth process, chemical reactants provided by source gases are controlled and system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

In some embodiments, material may need to be removed, and well-known semiconductor fabrication techniques can be used to do this. For example, chemical-mechanical polishing (CMP) can be used, which is a method of removing layers of solid by chemical-mechanical polishing carried out for the purpose of surface planarization and definition of metal interconnect pattern. CMP is typically used in back-end-of-line (BEOL) IC manufacturing, where BEOL means after formation of a first metal layer or first metallization.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Keeping in mind that the descriptions of semiconductor fabrication materials, techniques, and processes above are provided for example only, and that many other such materials, techniques, and processes will be known to one of ordinary skill in the art, embodiments will now be described in more detail with reference to the accompanying FIGS.

FIG. 1 shows an example of a resistor structure 100 according to embodiments disclosed herein and in the context of field effect transistor (FET) fabrication. Resistor structure 100 can have at least one resistor body 102 each on at least a portion of a resistor dielectric layer 104 on a surface of a first semiconductor layer 106, such as a substrate. While any dielectric material having appropriate properties can be employed, embodiments can use a gate dielectric such as is typically used in transistor fabrication, such as high dielectric constant (high-K) dielectric materials used in field effect transistor (FET) fabrication. Examples of such gate dielectric materials include silicon dioxide ($SiO_2$) and hafnium oxide ($HfO_2$). First semiconductor layer 106 can include, for example, polysilicon, silicon, or another suitable semiconductor material.

As noted above, FIG. 1 shows resistor structure 100 in the context of FET fabrication, which FET fabrication can include at least two trench isolations 108 formed in first semiconductor layer 106. Trench isolations 108 can be formed, for example, by shallow trench isolation (STI). Generally, in STI one or more trenches 110 are etched into substrate 106 and filled with an insulating material 112, such as oxide, to isolate one region of the substrate from an adjacent region of the substrate. One or more devices, such as transistors of a given polarity, may be disposed within an area isolated by STI. A suitable oxide is silicon dioxide ($SiO_2$), though any other suitable trench material can be used.

Here, insulating material 112 can also be referred to as a support dielectric material 112 deposited to not only fill trench(es) 110, but to form a support dielectric layer 114 on first semiconductor layer 106. A region between trench isolations 108 can be used to define a well 116 of embodiments in first semiconductor layer 106, but trench isolations 108 are not required to define well 116.

In embodiments, well 116 includes a doped region of first semiconductor layer 106 in which dopant type and concentration can be selected so as to inhibit formation of an inversion layer at the interface between first semiconductor layer 106 and support dielectric layer 104. The interface coincides with a surface 120 of first semiconductor layer 106 where resistor dielectric 104 is present. Surface 120 of first semiconductor layer 106 is also a surface of well 116 once well 116 is formed. In some embodiments, a concentration gradient can be formed in well 116, such as by multiple implantations of one or more dopants at different depths and/or concentrations in first semiconductor layer 106.

Well 116 can therefore include a first dopant 118, which can be deposited in well 116 at multiple concentrations $\sigma_n$. For example, first dopant 118 can be deposited at a first concentration $\sigma_1$ at a first distance $l_1$ from a surface 120 of well 116, and at a second concentration $\sigma_2$ at a second distance $l_2$ from surface 120 of well 116, second distance $l_2$ being larger than first distance $l_1$. In addition, first concentration $\sigma_1$ can be higher than second concentration $\sigma_2$, such that well 116 can have a gradient of concentration $\sigma$ with respect to surface 120 of well 116. An example of a suitable material to use as first dopant 118 includes boron (B), though other dopants can be used as may be suitable and/or desired, and any suitable technique may be used to deposit first dopant 118 in first semiconductor layer 106, such as ion implantation, for example. Also, while the example uses a P-type dopant, it should be recognized that an N-type dopant could be used if suitable and/or desired so long as inversion layer formation is inhibited.

As can be seen in FIG. 1, a plurality of cavities 121 can be formed in support dielectric layer 114 and can include resistor cavities 122 over well 116. Each resistor body 102 can be formed in a respective resistor cavity 122 in support dielectric layer 114 and can include, for example, a resistive material, such as doped polysilicon, or a silicide such as tungsten silicide (WSi). Where at least one resistor body 102 includes a doped polysilicon, a second dopant can further be included to imbue at least one resistor body 102 with appropriate and/or desired electrical properties, such as conductivity and/or resistance. Here, "second dopant" does not necessarily mean a different dopant than first dopant 118, and in fact the same dopant could be used in both well 116 and resistor bodies 102 within the scope of embodiments. Thus, in embodiments, a P-type dopant, such as boron, can be used, though any other dopant can be used as appropriate and can take into account the dopant used in well 116. As can also be seen in FIG. 1, each resistor cavity 122 can be lined with the resistor dielectric material to form resistor dielectric layer 104. In embodiments fabricated in conjunction with FETs, as seen in FIG. 1, resistor structure 100 at least one gate body 124 can be formed outside of well 116. Each gate body 124 can be formed in a respective gate cavity 126 and can include a metal, such as, but not limited to, copper (Cu) and/or aluminum (Al). While not part of resistor structure 100 itself, fabrication of resistor structure 100 in this context takes into account what should be done to properly form gate bodies 124.

To reiterate with reference to FIG. 1, a resistor structure 100 according to embodiments can include at least one resistor body 102, a resistor dielectric material 104 below the at least one resistor body 102, and a first semiconductor layer 106 of a first semiconductor material below the resistor dielectric material 104 and the at least one resistor body 102. A well 116 can be in the first semiconductor layer 106 below the resistor dielectric material 104, the well 116 including at least one doped region 118 of the first semiconductor layer 106 below the at least one resistor body 102. Each doped region 118 in well 116 can include a first dopant, a type of the first dopant and at least one concentration of the first dopant being selected to provide a depletion region in the well 116 at an operating voltage of the resistor structure 100. In embodiments, the first dopant can be at a first concentration $\sigma_1$ at a first distance $l_1$ from a surface 120 of well 116, and at a second concentration $\sigma_2$ at a second distance $l_2$ from surface 120 of well 116, second distance $l_2$ being larger than first distance $l_1$. In addition, first concentration $\sigma_1$ can be higher than second concentration $\sigma_2$, such that well 116 can have a gradient of concentration a with respect to surface 120 of well 116. The resistor dielectric material 104 can include at least one of silicon dioxide ($SiO_2$) or hafnium oxide ($HfO_2$), though other dielectric materials can be used as may be suitable and/or desired. In embodiments, each resistor body 102 can include a doped semiconductor material, such as polysilicon doped with a P-type dopant, such as boron (B).

As seen in FIG. 1, for example, an insulative layer, such as support dielectric layer 114, can be on first semiconductor layer 106, and a plurality of cavities 121 can be formed in the insulative layer to extend from a surface 115 of the insulative layer, such as support dielectric layer 114, to surface 120 of first semiconductor layer 106. The plurality of cavities 121 can include at least one resistor cavity 122 over well 116, and each of the at least one resistor body 102 can be disposed in a respective resistor cavity 122. In embodiments, each resistor cavity 122 can be lined with resistor dielectric material 104.

Figure 2:
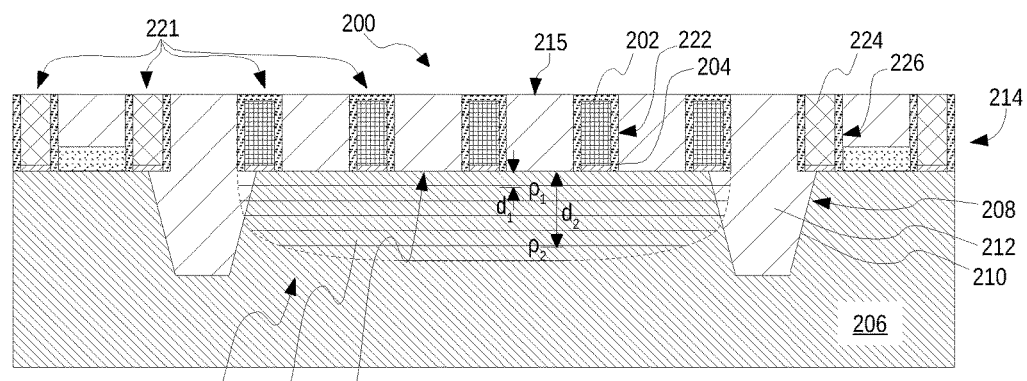

Another example of a semiconductor device resistor structure 200 can be seen in FIG. 2 and can include a first semiconductor layer 206 (substrate) of a first semiconductor material. The first semiconductor material can include, for example, polysilicon, silicon, or any other suitable semiconductor material. Resistor structure 200 can be disposed between at least two isolation trenches 210 in first semiconductor layer 206, trenches 210 being filled with a first electrically insulative material 212 to form shallow trench isolations 208. At least one doped region 218 can be disposed in well 216 and can include one or more dopants. For example, each doped region can include a first dopant at a first concentration $\rho_1$ at a first distance $d_1$ from a surface 220 of well 216 and at a second concentration $\rho_2$ at a second distance $d_2$ from surface 220 of well 216 that is larger than first distance $d_1$. Note that since well 216 is a region of first semiconductor layer 206, surface 220 is a surface of both first semiconductor layer 206 and well 216.

An electrically insulative support layer 214 can be formed on first semiconductor layer 206, and a plurality of cavities 221 can be formed in electrically insulative support layer 214. For example, plurality of cavities 221 can each extend from a surface 215 of electrically insulative support layer 214 to surface 220 of first semiconductor layer 206 and well 216. At least one resistor body 202 can each be formed over well 216 in a respective resistor cavity 222 of plurality of cavities 221. An electrically insulative resistor dielectric layer 204 can be formed at least between each resistor body 202 and surface 220 of first semiconductor layer 206 and/or well 216. In embodiments, electrically insulative resistor dielectric layer 204 can include any dielectric material, but can include a dielectric material used in fabrication of concurrently fabricated devices. For example, resistor structure 200 can be fabricated along with one or more field effect transistors (FETs), and electrically insulative resistor dielectric layer 204 can include a gate dielectric applied as part of fabricating the FETs. Examples of gate dielectrics include, but are not limited to, silicon dioxide ($SiO_2$) and hafnium oxide ($HfO_2$).

With continuing reference to FIG. 2, each resistor body 202 can include a resistive material, such as polysilicon, or a silicide such as tungsten silicide (WSi), either of which can be doped with a second dopant. Here, "second dopant" does not necessarily mean a dopant different from the first dopant of well 216, but is used to signify a second doping that could use the same dopant as well 116 or a different dopant. The second dopant can include, but is not limited to, one or more P-type dopants, such as boron (B), though other dopants can be used as may be appropriate. In embodiments implemented in conjunction with FET fabrication, as seen in FIG. 2, resistor structure 200 can be disposed between at least one gate body 224 outside of well 216. Each gate body 224 can be formed in a respective gate cavity 226 of plurality of cavities 221 in electrically insulative support layer 214 and can include a metal, such as, but not limited to, aluminum (Al). Gate bodies 224 are not part of resistor structure 200 per se, but fabrication of resistor structure 200 can overlap with and/or include portions of fabrication of concurrently formed FETs.

Figure 3:
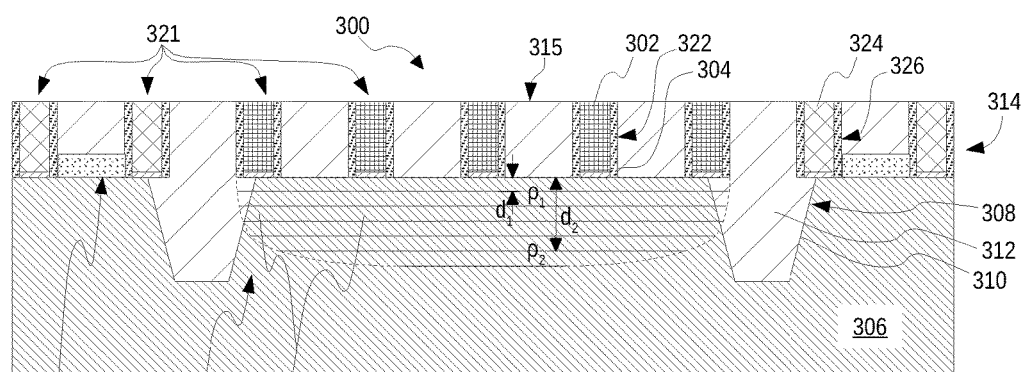

An additional example of a semiconductor device resistor structure 300 can be seen in FIG. 3 and has much the same structure as that shown in FIG. 2. For example, resistor structure 300 can include a first semiconductor layer 306 (substrate) of a first semiconductor material. In embodiments fabricated in conjunction with fabrication of, for example, FETs, resistor structure 300 can be disposed between shallow trench isolations 308, each of which can include an isolation trench 310 in first semiconductor layer 306 filled with a first electrically insulative material 312. As in the example of FIG. 2, at least one doped region 318 can be disposed in well 316, and can include at least one dopants, such as a first dopant at a first concentration $\rho_1$ at a first distance $d_1$ from a surface 320 of well 316 and at a second concentration $\rho_2$ at a second distance $d_2$ from surface 320 of well 316 that is larger than first distance $d_1$. Note that since well 316 is a region of first semiconductor layer 306, surface 320 is a surface of both first semiconductor layer 306 and well 316.

A support dielectric layer 314 can be formed on first semiconductor layer 306, such as by continuing deposition during formation of isolations 308 such that the material fills trenches 310 and then forms support dielectric layer 314. A plurality of cavities 321 can be formed in support dielectric layer 314. For example, plurality of cavities 321 can each extend from a surface 315 of support dielectric layer 314 to surface 320 of first semiconductor layer 306 and well 316. At least one resistor body 302 can each be formed over well 316 in a respective resistor cavity 322 of plurality of cavities 321. A resistor dielectric layer 304 can be formed at least between each resistor body 302 and surface 320 of first semiconductor layer 306 and/or well 316. In embodiments, resistor dielectric layer 304 can include any resistor dielectric material, but embodiments fabricated in conjunction with other devices and/or structures can include dielectric materials used in the other devices and/or structures. For example, in embodiments where resistor structure 300 is fabricated in conjunction with fabrication of one or more FETs, a gate dielectric of the FETs can be used to form resistor dielectric layer 304. Examples of gate dielectrics include, but are not limited to, silicon dioxide ($SiO_2$) and hafnium oxide ($HfO_2$). In addition, each resistor body 302 can include a resistive material, such as polysilicon, or a silicide such as tungsten silicide (WSi), either of which can be doped with a second dopant. As above, "second dopant" does not necessarily mean a dopant different from the first dopant of well 316, but is used to signify a second doping that could use the same dopant as well 316 or a different dopant. The second dopant can include, but is not limited to, one or more P-type dopants, such as boron (B), though other dopants can be used as may be appropriate. In embodiments, as seen in FIG. 3, resistor structure 300 can include at least one gate body 324 outside of well 316. Each gate body 324 can be formed in a respective gate cavity 326 of plurality of cavities 321 in first electrically insulative layer 314 and can include a metal, such as, but not limited to, titanium nitride (TiN), polysilicon, or another material used in semiconductor fabrication as a gate material.

Figure 4:
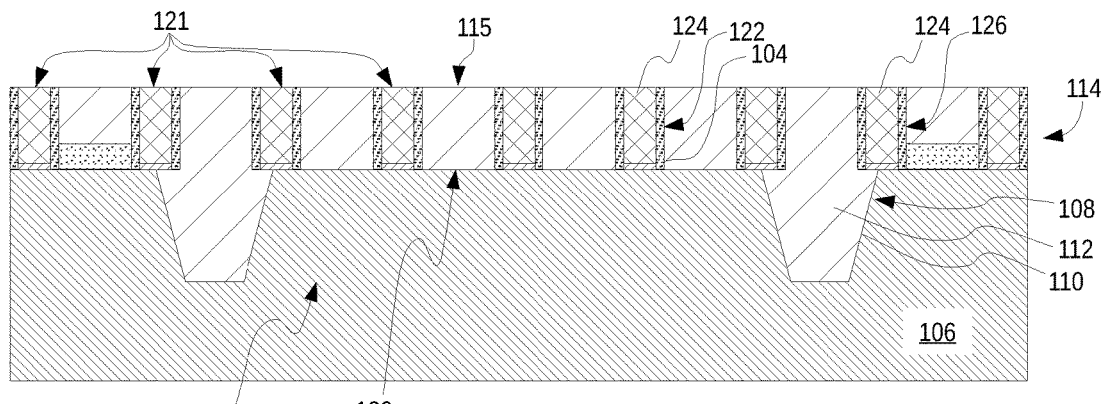
FIGS. 4-7 show examples of stages of fabrication to make an implementation of a semiconductor device resistor structure according to embodiments of the disclosure such as shown in the example of FIG. 1.
Figure 5:
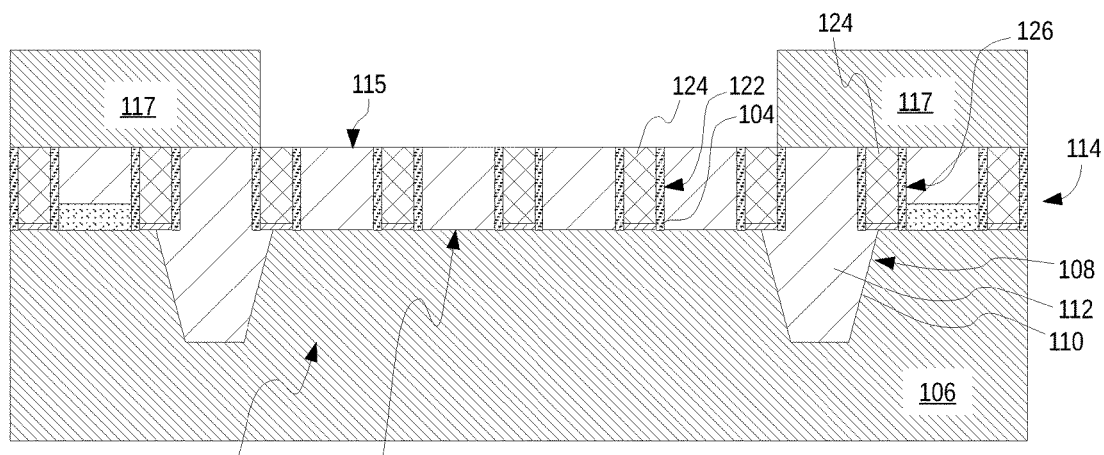
Figure 6:
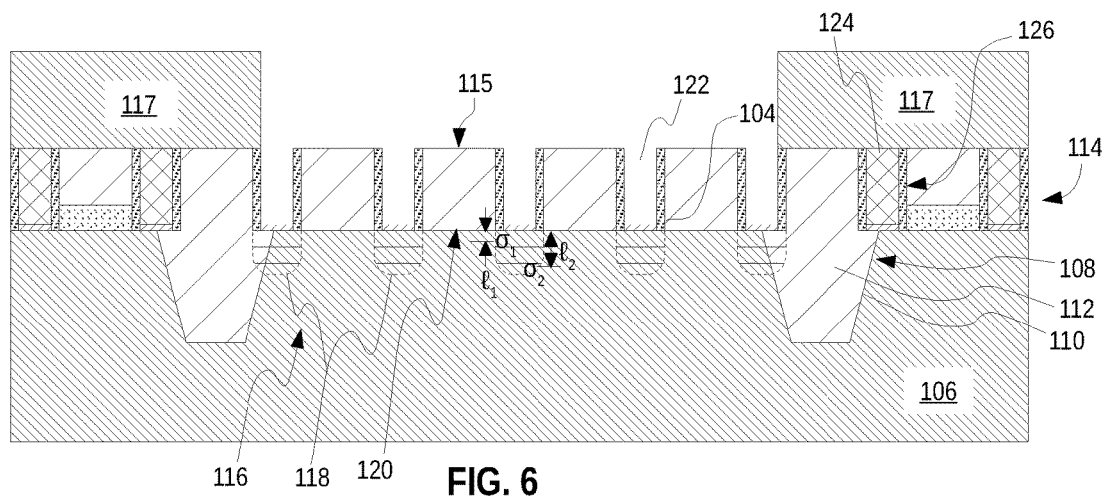
Figure 7:
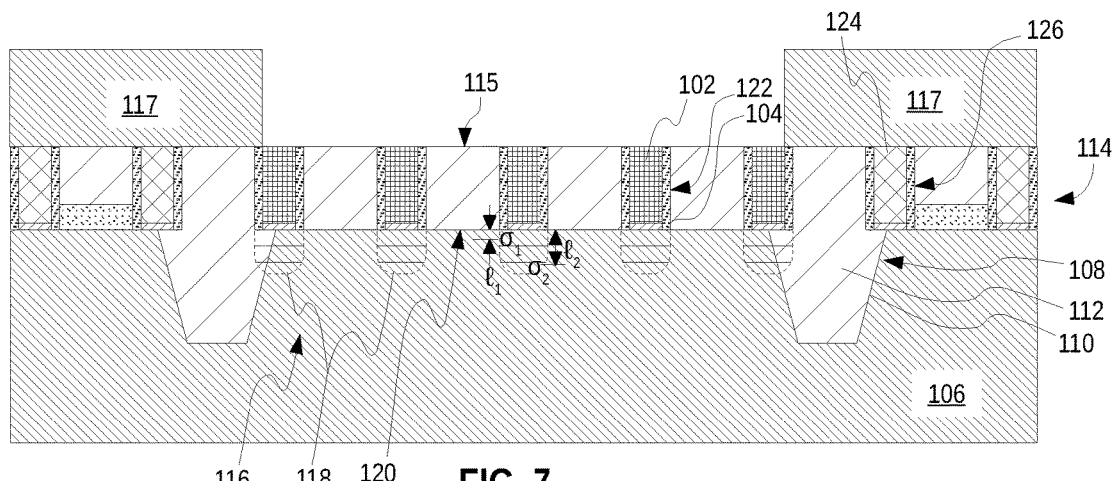

An example of fabrication stages that can be performed to yield the example of FIG. 1 is shown in FIGS. 4-7. FIG. 4 shows a starting stage that can be reached by steps well known to those skilled in the art and is a stage that can be found in many existing fabrication processes, such as fabrication of field effect transistors (FETs). As shown in FIG. 4, cavities 121 in first insulative layer 114 have been filled with gate material, such as a metal or other suitable material, which can include, for example, titanium nitride (TiN), polysilicon, or another material used in semiconductor fabrication as a gate material. Thus, cavities 121 can be filled with gate material to form gate bodies 124 in all of cavities 121, including resistor cavities 122 and gate cavities 126. To form well 116 and resistor bodies 102, with reference to FIG. 5, a masking layer 117 can be formed over gate cavities 126, and gate material can be removed from resistor cavities 122 (FIG. 6). Well region 116 can be doped through empty resistor cavities 122, such as by ion implantation of first dopant 118 (FIG. 6) at one or more energy levels. Ion implantation or another suitable technique can be employed to dope well region 116 and/or resistor bodies 102, and to achieve the concentration gradient described above in well region 116, ion implantation at multiple energies can be used. As shown in FIG. 7, resistor bodies 102 can then be formed, such as by deposition of resistive material. If needed, resistor bodies 102 can be modified with a second dopant or even the first dopant, and masking or other techniques can be used to facilitate such modification. Masking layer 117 can then be removed to yield resistor structure 100 of FIG. 1.

It should be noted that these fabrication stages can be employed with conventional resistors formed on insulators on the same wafer without damaging such conventional resistors. In addition, embodiments can yield what amounts to a conventional resistor structure when implemented over an insulator. An example of a semiconductor device resistor structure 400 formed over insulator can be seen in FIG. 8 and in some ways is similar to that shown in FIG. 1. At least one resistor body 402 can be formed on a resistor dielectric layer 404 in respective resistor cavities 422 in a support dielectric layer 414, and at least one gate body 424 can be formed in respective gate cavities 426 in support dielectric layer 414. However, where a well 416 would be formed in other implementations, here that region is occupied by an insulative mass 408, such as a trench isolation including a trench 410 filled with an electrically insulative material 412, such as silicon dioxide ($SiO_2$). Resistor dielectric layer 404 can be formed under each resistor body 402 at a level of a surface 420 of support dielectric layer 414. However, here the processes used to form well 416 in a structure according to other embodiments are instead applied to trench isolation 408, such that first dopant used to form at least one doped region 418 can be deposited in the electrically insulative material 412 in trench 410. Thus, the first dopant can be disposed in the region that would otherwise be well 416, such as at a first concentration $\sigma_1$ at a first distance $l_1$ from the level of surface 420 and at a second concentration $\sigma_2$ at a second distance $l_2$ from a level of surface 420 that is larger than first distance $l_1$, but the dopant gradient has negligible effect on resistor structure 400 since it is formed in a dielectric/electrically insulative material.

Figure 9:
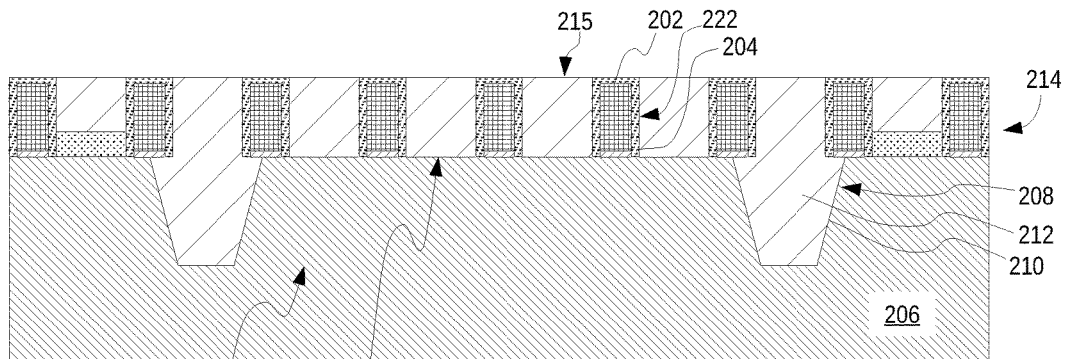
FIGS. 9-14 show examples of steps taken to make another implementation of a semiconductor resistor structure according to other embodiments of the disclosure such as shown in the example of FIG. 2.
Figure 10:
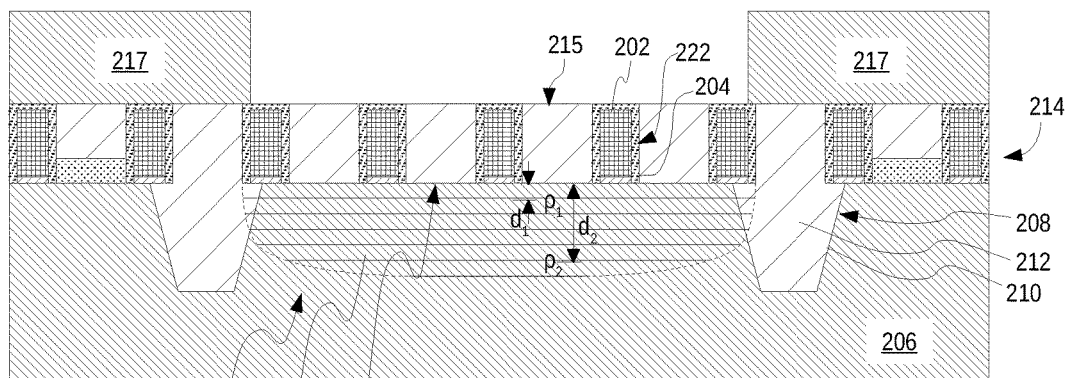
Figure 11:
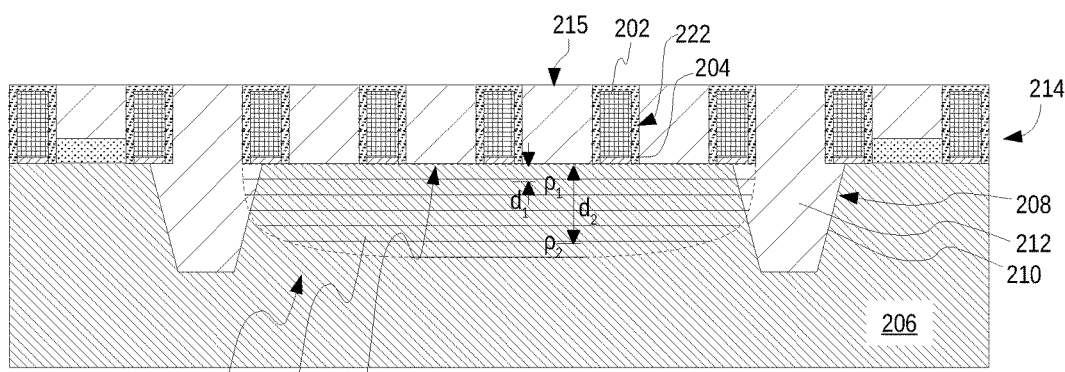

Another example of fabrication stages that can be used to yield a resistor structure 200, such as the example of FIG. 2, is illustrated in FIGS. 9-14, again in the context of concurrent fabrication of other devices or structures, such as field effect transistors (FETs). FIG. 9 shows a starting stage that can be reached by steps well known to those skilled in the art and is a stage that can be found in many existing fabrication processes. For example, resistor bodies 202 can be formed in cavities 221 (FIG. 9), such as by depositing the resistive material, which may include removing excess deposits thereof from surface 215 of first electrically insulative layer 214 or other processes as may be known in the art. In embodiments, well region 216 can include at least one doped region 218 that can be doped with a first dopant as seen in FIG. 10, such as through resistor bodies 202 and support dielectric layer 214 after depositing one or more masking layers 217 over gate cavities 226, to be used in fabrication of FETS and here filled with resistive material as a result of deposition to form resistor bodies 202. This can be advantageous where resistive material needs to be doped with a second dopant (which could include the first dopant at the same or at different concentration(s)) to adjust electrical properties of resistor bodies 202. Ion implantation or another suitable technique can be employed to dope well region 216 and/or resistor bodies 202, and to achieve the concentration gradient described above in well region 216, ion implantation at multiple energies can be used. Masking can be employed over resistor bodies 202 if needed to fine tune implantation in well region 216 and/or resistor bodies 202, as illustrated by masking layer(s) 217 in FIG. 10. Masking layer(s) 217 can then be removed to expose (undoped) resistor bodies 202 in gate cavities 226, as seen in FIG. 11.

Figure 12:
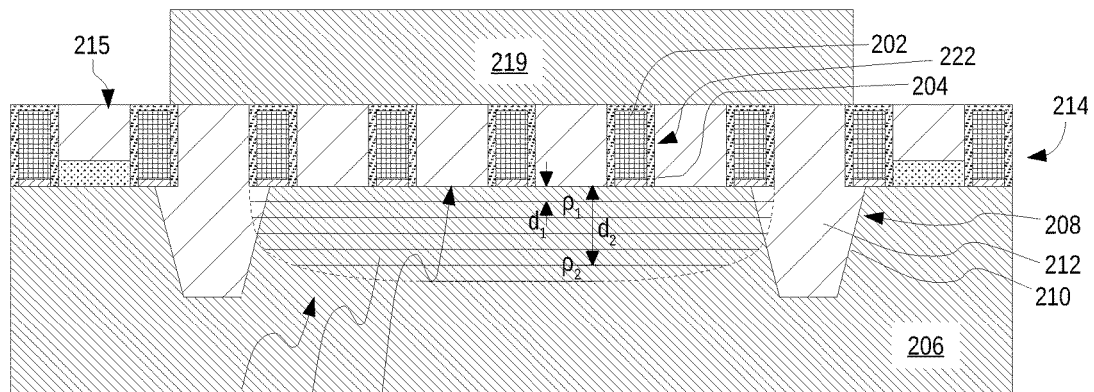
Figure 13:
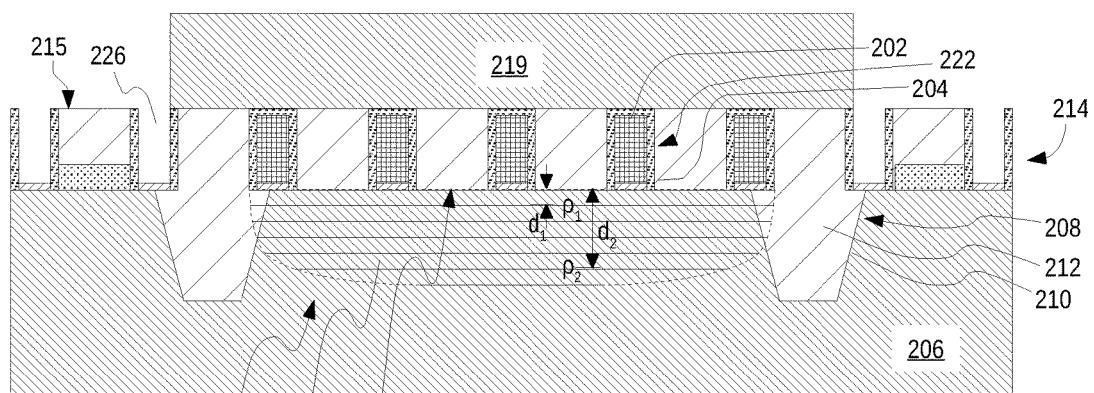
Figure 14:
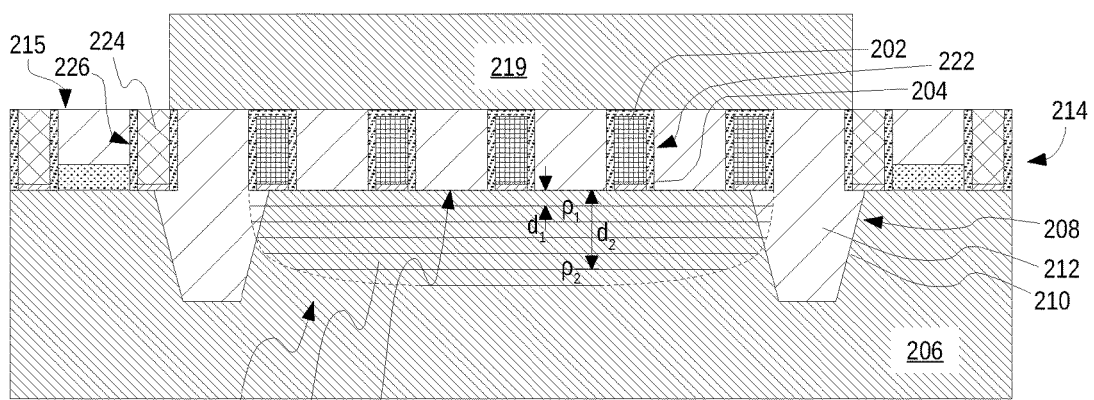

Since resistor bodies 202 have been deposited in gate cavities 226 (FIGS. 9-11), gate cavities 226 can be cleared and instead filled with gate material to form gate bodies 224 for concurrently fabricated FETs. For example, as seen in FIG. 12, one or more masking layers 219 can be applied over (doped) resistor bodies 202 in resistor cavities 222 (over well region 216), and known semiconductor fabrication processes can be employed to remove resistor bodies 202 from gate cavities 226 as seen in FIG. 13. Gate bodies 224 can then be formed in gate cavities 226 as illustrated in FIG. 14, such as by removing masking layer 219, depositing a metal or other suitable gate material, and planarizing to yield resistor structure 200 of FIG. 2.

Either of first and second examples of fabrications stages shown in FIGS. 4-7 and 9-14 can be employed to yield the example of FIG. 3, though the second example illustrated in FIGS. 9-14 may be more suitable. In such a case, spacer material on top of resistor bodies 302 can be removed, such as by chemical mechanical polishing (CMP) or another semiconductor fabrication technique well known to those skilled in the art.

Thus, a method of making a resistor structure 100, 200, such as in FIG. 1 or 2 can include providing a starting stage as shown in FIG. 4 or FIG. 9. For example, a first semiconductor layer 106, 206 can be provided that can include a first semiconductor material, a support dielectric material can be deposited on first semiconductor layer 106, 206 to form a support dielectric layer 114, 214, and a plurality of cavities 121, 221 can be formed in support dielectric layer 114, 214. A well region 116, 216 can be defined or formed in first semiconductor layer 114, 214, such as by doping first semiconductor layer 106, 206 to form at least one doped region 118, 218. When embodiments are implemented concurrent with fabrication of other structures or devices, such as FETs, well 116, 216 can be disposed between at least two shallow trench isolations (STIs) 108, 208, in which case trench(es) 110, 210 can be filled with support dielectric material 112, 212, and deposition of support dielectric material 112, 212 can be continued to form support dielectric layer 114, 214 on a surface 120, 220 of substrate 106, 206 using well known semiconductor fabrication techniques. The method can further include forming a plurality of cavities 121, 221 in the support dielectric layer 114, 214, the cavities 121, 221 extending from a surface 115, 215 of support dielectric layer 114, 214 to surface 120, 220 of substrate 106, 206, plurality of cavities 121, 221 including at least one resistor cavity 122, 222 over well region 116, 216. Additionally, the method can include doping well region 116 (with a dopant 118, 218), depositing a support dielectric layer 104, 204 over at least surface 120, 220 of first semiconductor layer 106, 206 exposed in the plurality of cavities 121, 221, and forming a resistor body 102, 202 in each resistor cavity 122, 222. Forming a resistor body 102, 202 in each resistor cavity 122, 222 can further include depositing a resistor dielectric material 104, 204 on at least surface 120, 220 of first semiconductor 106, 206/well 116, 216 before depositing the resistive material. In addition, depositing of the resistor dielectric material can include depositing at least one of silicon dioxide ($SiO_2$) or hafnium oxide ($HfO_2$) on at least the surface 120, 220 of the first semiconductor layer 106, 206.

In embodiments implemented concurrently with the fabrication or other devices and/or structures, such as FETs, the plurality of cavities 121, 221 can include at least two gate cavities 126, 226 outside of the well region 116, 216, and forming of the resistor bodies 102, 202 can include depositing a resistive material to form a resistor body 102, 202 in each cavity 122, 222 over the well region, which can also fill the gate cavities 126, 226 with the resistive material. The method can then include removing the resistive material from the at least two gate cavities 126, 226, and depositing a gate material at least in the gate cavities 126, 226.

Figure 8:
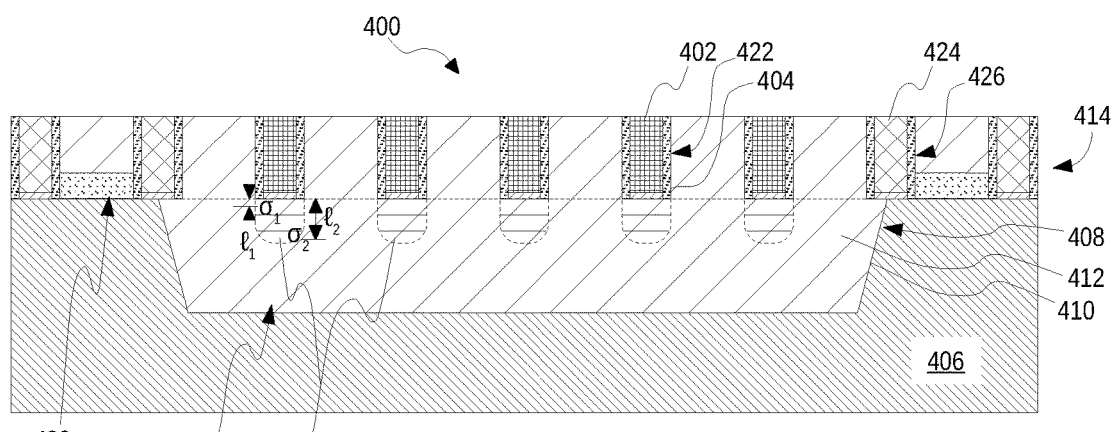
FIG. 8 illustrates an example of a resistor structure resulting from an implementation of a semiconductor device structure according to embodiments of the disclosure have been applied.

In other embodiments, the method can include forming gate bodies 124, 224 by depositing a gate material in the plurality of cavities 121 and thereby filling the resistor cavities 122, 222 with the gate material as well as filling the gate cavities 126, 226. In addition, the method can then include removing the gate material from the at least one resistor cavity 122, 222 and depositing a resistive material in the at least one resistor cavity 122, 222. In some embodiments, where a well 416 would otherwise be defined, an insulator, such as in a single trench isolation 408 can be formed as shown in FIG. 8 in the material of the first semiconductor layer 106, 206. The remainder of the steps in fabrication can remain substantially unchanged and can thus yield, for example, the implementation shown in FIG. 8.

In embodiments, the first semiconductor material can include polysilicon, though any other suitable semiconductor material can be used. In addition, doping the first semiconductor layer to form the at least one doped region can include implanting a first dopant at a first concentration at a first distance from the surface of the first semiconductor layer, as well as implanting the first dopant at a second concentration at a second distance from the surface of the first semiconductor layer that is greater than the first distance. In embodiments in which first and second concentrations are used, the first concentration can be higher than the second concentration. Additionally, the first semiconductor layer can include silicon, and the first dopant can include a P-type dopant.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The methods as described above are, e.g., used in the fabrication of integrated circuit chips, such as in a packaged form (3D package). The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device resistor structure, the method comprising:
   providing a first semiconductor layer including a first semiconductor material;
   depositing a support dielectric material on the first semiconductor layer to form a support dielectric layer on a surface of the first semiconductor layer;
   forming a plurality of cavities in the support dielectric layer, each cavity extending from a surface of the support dielectric layer to the surface of the first semiconductor layer;
   forming a well region in the first semiconductor layer by doping the first semiconductor layer to form at least one doped region, the plurality of cavities including at least one resistor cavity over the well region and at least two gate cavities outside of the well region;
   depositing a resistor dielectric layer on at least the surface of the first semiconductor layer exposed in the plurality of cavities;
   forming a resistor body in each resistor cavity and on the resistor dielectric layer, the forming of the resistor body in each resistor cavity including depositing a resistive material in each resistor cavity, the depositing of the resistive material including filling the at least two gate cavities with the resistive material;
   removing the resistive material from the at least two gate cavities; and
   depositing a gate material at least in the gate cavities.

2. The method of claim 1, wherein the depositing of the resistor dielectric layer includes depositing a gate dielectric material on at least the surface of the well region exposed in the at least one resistor cavity.

3. The method of claim 1, wherein the depositing of the resistor dielectric layer includes depositing at least one of silicon dioxide (SiO$_2$) or hafnium oxide (HfO$_2$) on at least the surface of the well region exposed in the at least one resistor cavity.

4. The method of claim 1, wherein the first semiconductor material includes polysilicon, and
the forming of the well region in the first semiconductor layer by doping of the first semiconductor layer to form the at least one doped region includes:
implanting a first dopant at a first concentration at a first distance from the surface of the first semiconductor layer and implanting the first dopant at a second concentration at a second distance from the surface of the first semiconductor layer that is greater than the first distance, the first concentration being higher than the second concentration.

5. The method of claim 4, wherein the first semiconductor layer includes silicon and the first dopant includes a P-type dopant.

6. A method of making a semiconductor device resistor structure, the method comprising:
providing a first semiconductor layer including a first semiconductor material;
depositing a support dielectric material on the first semiconductor layer to form a support dielectric layer on a surface of the first semiconductor layer;
forming a plurality of cavities in the support dielectric layer, each cavity extending from a surface of the support dielectric layer to the surface of the first semiconductor layer;
forming a well region in the first semiconductor layer by doping the first semiconductor layer to form at least one doped region, the plurality of cavities including at least one resistor cavity over the well region;
depositing a resistor dielectric layer on at least the surface of the first semiconductor layer exposed in the plurality of cavities;
forming gate bodies by depositing a gate material in the plurality of cavities, the depositing of the gate material including filling the at least one resistor cavity with the gate material; and
forming a resistor body in each resistor cavity and on the resistor dielectric layer, the forming of the resistor body in each resistor cavity including removing the gate material from the at least one resistor cavity and depositing a resistive material in the at least one resistor cavity.

7. The method of claim 6, wherein the depositing of the resistor dielectric layer includes depositing a gate dielectric material on at least the surface of the well region exposed in the at least one resistor cavity.

8. The method of claim 6, wherein the depositing of the resistor dielectric layer includes depositing at least one of silicon dioxide (SiO$_2$) or hafnium oxide (HfO$_2$) on at least the surface of the well region exposed in the at least one resistor cavity.

9. The method of claim 6, wherein the first semiconductor material includes polysilicon, and
the forming of the well region in the first semiconductor layer by doping of the first semiconductor layer to form the at least one doped region includes:
implanting a first dopant at a first concentration at a first distance from the surface of the first semiconductor layer and implanting the first dopant at a second concentration at a second distance from the surface of the first semiconductor layer that is greater than the first distance, the first concentration being higher than the second concentration.

10. The method of claim 9, wherein the first semiconductor layer includes silicon and the first dopant includes a P-type dopant.

11. A method of making a semiconductor device resistor structure, the method comprising:
providing a first semiconductor layer including a first semiconductor material;
depositing a support dielectric material on the first semiconductor layer to form a support dielectric layer on a surface of the first semiconductor layer;
forming a plurality of cavities in the support dielectric layer, each cavity extending from a surface of the support dielectric layer to the surface of the first semiconductor layer;
forming a well region in the first semiconductor layer by doping the first semiconductor layer to form at least one doped region, the plurality of cavities including at least one resistor cavity over the well region, the forming of the well region by doping including implanting a first dopant at a first concentration at a first distance from the surface of the first semiconductor layer and implanting the first dopant at a second concentration at a second distance from the surface of the first semiconductor layer that is greater than the first distance, the first concentration being higher than the second concentration;
depositing a resistor dielectric layer on at least the surface of the first semiconductor layer exposed in the plurality of cavities; and
forming a resistor body in each resistor cavity and on the resistor dielectric layer.

12. The method of claim 11, wherein the plurality of cavities includes at least two gate cavities outside of the well region; wherein the forming of the resistor body in each resistor cavity includes depositing a resistive material in each resistor cavity, the depositing of the resistive material including filling the at least two gate cavities with the resistive material; and wherein the method further comprises:
removing the resistive material from the at least two gate cavities; and
depositing a gate material at least in the gate cavities.

13. The method of claim 11, further comprising forming gate bodies by depositing a gate material in the plurality of cavities, the depositing of the gate material including filling the at least one resistor cavity with the gate material; and wherein the forming of the resistor body in each resistor cavity includes:
removing the gate material from the at least one resistor cavity, and
depositing a resistive material in the at least one resistor cavity.

14. The method of claim 11, wherein the depositing of the resistor dielectric layer includes depositing a gate dielectric material on at least the surface of the well region exposed in the at least one resistor cavity.

15. The method of claim 11, wherein the depositing of the resistor dielectric layer includes depositing at least one of silicon dioxide (SiO$_2$) or hafnium oxide (HfO$_2$) on at least the surface of the well region exposed in the at least one resistor cavity.

16. The method of claim 11, wherein the first semiconductor layer includes silicon and the first dopant includes a P-type dopant.

* * * * *